(12) United States Patent
Weber et al.

(10) Patent No.: US 10,836,141 B2
(45) Date of Patent: Nov. 17, 2020

(54) CURVED COMPOSITE GLASS PANEL WITH AN EMBEDDED CURVED COHERENT DISPLAY AND METHOD FOR PRODUCING THE SAME

(71) Applicant: SAINT-GOBAIN GLASS FRANCE, Courbevoie (FR)

(72) Inventors: Patrick Weber, Alsdorf (DE);
Ali-Osman Kizmaz, Würselen (DE);
Sara Borhani Haghighi, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 16/616,106

(22) PCT Filed: May 8, 2018

(86) PCT No.: PCT/EP2018/061837
§ 371 (c)(1),
(2) Date: Nov. 22, 2019

(87) PCT Pub. No.: WO2018/215199
PCT Pub. Date: Nov. 29, 2018

(65) Prior Publication Data
US 2020/0156350 A1    May 21, 2020

(30) Foreign Application Priority Data
May 24, 2017   (EP) ..................................... 17172782

(51) Int. Cl.
*H01L 29/08* (2006.01)
*B32B 17/10* (2006.01)
(Continued)

(52) U.S. Cl.
CPC .......... *B32B 17/10036* (2013.01); *B32B 1/00* (2013.01); *B32B 7/12* (2013.01);
(Continued)

(58) Field of Classification Search
CPC ........ B32B 17/10036; B32B 17/10761; B32B 17/06; B32B 17/10541; B32B 17/10788;
(Continued)

(56) References Cited

U.S. PATENT DOCUMENTS 5,208,080 A    5/1993  Gajewski et al.
7,892,616 B2   2/2011  Huchet
(Continued)

FOREIGN PATENT DOCUMENTS

CN        202503691 U    10/2012
DE   10 2007 012 571 A1  1/2008
(Continued)

OTHER PUBLICATIONS

International Search Report as issued in International Patent Application No. PCT/EP2018/061837, dated Jul. 25, 2018.

*Primary Examiner* — Robert G Bachner
(74) *Attorney, Agent, or Firm* — Pillsbury Winthrop Shaw Pittman LLP

(57) ABSTRACT

A method for producing a curved composite glass panel with an embedded curved coherent display, the composite glass panel having first and second curved glass layers, wherein the display has a display layer and an electronics layer. The display layer has a first layer thickness and the electronics layer has a second layer thickness. A first intermediate film is arranged between the electronics layer and the second glass layer. A second intermediate film is arranged adjacent the electronics layer and the first intermediate film. A third intermediate film is arranged adjacent the display layer. The composite glass panel has a first bonding layer between the first glass layer and the third intermediate film and between the first glass layer and the display layer, and has a second
(Continued)

Figure 1:
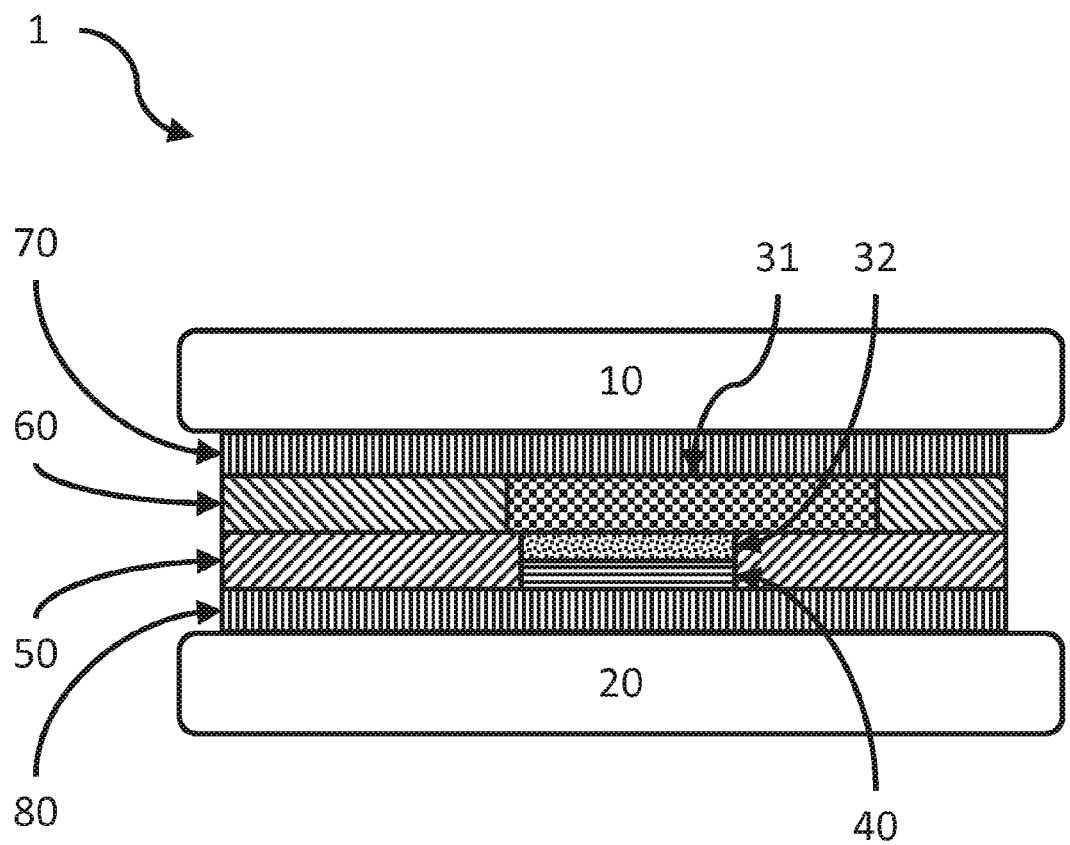

bonding layer between the second glass layer and the first intermediate film and between the second glass layer and the second intermediate film.

10 Claims, 5 Drawing Sheets

(51) Int. Cl.
    *B32B 1/00*     (2006.01)
    *B32B 7/12*     (2006.01)
    *H01L 51/00*     (2006.01)
    *H01L 51/56*     (2006.01)

(52) U.S. Cl.
    CPC .... *B32B 17/1099* (2013.01); *B32B 17/10743* (2013.01); *B32B 17/10752* (2013.01); *B32B 17/10761* (2013.01); *B32B 17/10779* (2013.01); *H01L 51/0097* (2013.01); *H01L 51/56* (2013.01); *B32B 2250/05* (2013.01); *B32B 2457/206* (2013.01)

(58) Field of Classification Search
CPC .......... B32B 2605/006; B32B 2605/08; B32B 17/10; B32B 17/10293; B32B 17/10614; B32B 2419/00; B32B 2457/12; B32B 7/12; B32B 17/064; B32B 17/1011; B32B 2307/412; B32B 2307/416; B32B 2307/418; B32B 2307/422; B32B 2311/12; B32B 2315/08; B32B 2327/12; B32B 2329/06; B32B 2457/20; B32B 27/06; B32B 27/28; B32B 27/306; B32B 3/02; B32B 3/14; B32B 15/02; B32B 15/082; B32B 15/20; B32B 17/00; B32B 17/08; B32B 17/10008; B32B 17/10018; B32B 17/10091; B32B 17/10119; B32B 17/10137; B32B 17/10165; B32B 17/10174; B32B 17/1022; B32B 17/10339; B32B 17/10348; B32B 17/10449; B32B 17/10513; B32B 17/10633; B32B 17/10651; B32B 17/10733; B32B 17/10743; B32B 17/10779; B32B 17/10798; B32B 17/10871; B32B 17/10889; B32B 17/10908; B32B 17/10935; B32B 1/04; B32B 2250/03; B32B 2255/26; B32B 2264/12; B32B 2305/30; B32B 2305/72; B32B 2307/102; B32B 2307/306; B32B 2307/402; B32B 2307/41; B32B 2307/42; B32B 2307/546; B32B 2307/558; B32B 2307/7265; B32B 2307/732; B32B 2307/738; B32B 2309/105; B32B 2309/68; B32B 2311/20; B32B 2317/18; B32B 2331/04; B32B 2333/12; B32B 2367/00; B32B 2457/206; B32B 2457/208; B32B 2509/00; B32B 2519/00; B32B 2551/08; B32B 2590/00; B32B 2605/00; B32B 27/08; B32B 27/285; B32B 27/30; B32B 27/32; B32B 27/36; B32B 37/003; B32B 37/0046; B32B 37/06; B32B 37/10; B32B 3/18; B32B 7/04; B32B 7/14; H04M 1/7253; H04M 2250/12; H04M 1/72519; H04M 1/72569; H04M 2250/02; H04M 1/0264; H04M 1/0266; H04M 1/66; H04M 1/67; H04M 1/72516; H04M 1/0268; H04M 1/72552; H04M 1/72572; H04W 4/80; H04W 12/06; H04W 12/003; H04W 12/08; H04W 12/02; H04W 12/04; H04W 4/008; H04W 76/14; H04W 4/029; G06F 3/0416; G06F 3/044; G06F 3/04883; G06F 3/016; G06F 3/0482; G06F 1/1626; G06F 1/163; G06F 1/1652; G06F 3/011; G06F 3/017; G06F 3/0414; G06F 9/451; G06F 13/385; G06F 1/1605; G06F 1/1637; G06F 1/1686; G06F 1/1694; G06F 2203/04102; G06F 3/013; G06F 3/041; G06F 3/0412; G06F 3/0481; G06F 3/04842; G06F 3/04845; G06F 3/0488; G06F 16/16; G06F 16/24578; G06F 16/27; G06F 16/51; G06F 16/9535; G06F 1/1613; G06F 1/1633; G06F 1/1643; G06F 2203/0338; G06F 2203/04105; G06F 2203/04112; G06F 2203/04803; G06F 2209/5019; G06F 3/01; G06F 3/0304; G06F 3/0346; G06F 3/04186; G06F 3/047; G06F 3/048; G06F 3/04817; G06F 3/0484; G06F 3/04847; G06F 3/0487; G06F 3/0604; G06F 3/0647; G06F 3/0653; G06F 3/0673; G06F 3/14; G06F 3/1423; G06F 40/186; G06F 8/65; G06F 9/445; G06F 9/485

See application file for complete search history.

(56) References Cited

U.S. PATENT DOCUMENTS

| | | |
|---|---|---|
| 2011/0025574 A1 | 2/2011 | Tiezzi et al. |
| 2011/0025584 A1* | 2/2011 | Nishigasako ..... B32B 17/10036 345/76 |
| 2011/0169705 A1 | 7/2011 | Goldberger |
| 2015/0303404 A1 | 10/2015 | Domercq et al. |

FOREIGN PATENT DOCUMENTS

| | | |
|---|---|---|
| EP | 2 926 388 A1 | 10/2015 |
| WO | WO 2014/083110 A1 | 6/2014 |

* cited by examiner

CURVED COMPOSITE GLASS PANEL WITH AN EMBEDDED CURVED COHERENT DISPLAY AND METHOD FOR PRODUCING THE SAME

CROSS-REFERENCE TO RELATED APPLICATIONS

This application is the U.S. National Stage of PCT/EP2018/061837, filed May 8, 2018, which in turn claims priority to European patent application number 17 172 782.9, filed May 24, 2017. The content of these applications are incorporated herein by reference in their entireties.

The invention relates to a curved composite glass panel with an embedded curved coherent display and a method for producing the same.

In many sectors, there is a desire to integrate displays into glass panels.

For example, from U.S. Pat. No. 7,892,616 B2, a method is known wherein a rigid element can be connected to a glass element using adapters.

Furthermore, it is, for example, known from US patent application 2011/0 169 705 A1 to arrange a large number of rigid elements connected by flexible cables in a glass pane.

From U.S. Pat. No. 5,208,080, a method is known for laminating a semi-rigid material between glass.

Furthermore, European patent application EP 2 926 388 A1 presents the lamination of an electronic or opto-electronic device.

However, increasingly, there is also a demand for more complex glass areas in which a display is embedded.

However, with prior art methods, curved glass areas with internal displays, for example, are extremely difficult to produce, since spacers with complex profiles are introduced that compensate in the profile for insertion of a rigid display into a curved composite glass panel.

From US 2015/0 303 404 A1, it is known to insert a rigid OLED display into a composite glass panel.

From CN 2052503691 U, a straight glass panel with an OLED is known.

From US 2011/0 025 574 A1, a head-up display that is mounted on the inner side of a finished windshield is known.

Known from DE 10 2007 012 571 A1 is a windshield with a rigid OLED display, wherein the hollow spaces created are filled with glycerine. If the OLED display is large, the document provides for sanding the panes accordingly. However, the size of a display depends on the curvature and the thickness of the panes. In addition to complex production, the long-term stability of the pane thus produced is problematic, in particular with regard to the filler material to be used.

The result is that, for example, in the case of composite glass panels with a relatively complex profile, certain regions cannot be used for displays or can be used only for very small displays. In other words, displays cannot be placed freely.

It should also be noted that with displays, the electronics occupy only a very small part compared to the display area. Consequently, in addition to the necessity of adapting the profile to the curve, there is also a necessity of adapting to different thicknesses.

In particular, in the case of large displays and/or in the case of strong curves, this results in the fact that either stresses occur at the edges of the display and thus damage to the displays on the edge or that the thickness of a composite glass panel increases significantly.

There is also a problem with regard to the electronics layer. If the matching profile is not adequately dimensioned, stresses that can damage the electronics occur. This is noted in particular when the electronics are in close contact with a glass layer, in particular when the electronics rest directly on the glass layer.

Against this background, the object is to provide a curved composite glass panel having an embedded display.

The object is accomplished by a method for producing a curved composite glass panel having an embedded curved coherent display. The composite glass panel has a first curved glass layer and a second curved glass layer, while the display has a display layer and an electronics layer. The display layer and the electronics layer are shaped differently, wherein the display layer has a first layer thickness and the electronics layer has a second layer thickness. Arranged between the electronics layer and the second glass layer is a first intermediate film, which has the same area as the electronics layer. The first intermediate film has a third layer thickness. Arranged adjacent the electronics layer and the first intermediate film is a second intermediate film, which has a layer thickness equal to the sum of the second layer thickness and the third layer thickness. Arranged adjacent the display layer is a third intermediate film, which has a layer thickness roughly corresponding to the first layer thickness. The composite glass panel further has a first bonding layer between the first glass layer and the third intermediate film and between the first glass layer and the display layer. The composite glass panel further has a second bonding layer between the second glass layer and the first intermediate film and between the second glass layer and the second intermediate film. The method has a step of obtaining the first curved glass layer and the second curved glass layer, the step of obtaining a non-curved coherent display. The method further has the step of arranging the display obtained between the curved glass layers such that the third intermediate film is arranged adjacent the display layer, and such that the second intermediate film is arranged adjacent the electronics layer and the first intermediate film, wherein the first bonding layer is arranged above the display layer, and wherein the second bonding layer is arranged below the first intermediate film. In another step, the assembly is warmed at least in the region of the display at a temperature of 50° C.-100° C. such that, under the influence of the warming, the display layer and the electronics layer bend and adapt to the curve of the first glass layer or second glass layer. Then, the curved layers thus obtained are bonded by means of an autoclave.

In other words, the invention enables introducing even large-format (previously non-curved) coherent displays into curved panels, without the panel thickness being negatively affected or without running the risk of either the display layer or the electronics layer being compromised. In one embodiment of the invention, the step of warming includes a temperature rise in a period of more than 30 minutes.

Due to the relatively long temperature rise, the display layer and the electronics layer are warmed so slowly that the electronics layer and the display layer, which are constructed from different materials, warm up evenly such that no large temperature gradients develop that could result in cracks in the electronics or the connection of the electronics layer to the display layer.

The object is also accomplished by a composite glass panel, which is produced by a method according to the invention.

In one embodiment of the invention, the intermediate layers contain at least one material selected from the group comprising polybutylene terephthalate (PBT), polycarbonate (PC), polyethylene terephthalate (PET) and polyethylene naphthalate (PEN), polyvinyl chloride (PVC), polyvinyl fluorides (PVF), polyvinyl butyral (PVB), ethylene vinyl acetate (EVA), polyacrylate (PA), polymethyl methacrylate (PMMA), polyurethane (PUR), and/or mixtures and copolymers thereof.

In one embodiment of the invention, the bonding layers contain at least one material selected from the group comprising polybutylene terephthalate (PBT), polycarbonate (PC), polyethylene terephthalate (PET) and polyethylene naphthalate (PEN), polyvinyl chloride (PVC), polyvinyl fluorides (PVF), polyvinyl butyral (PVB), ethylene vinyl acetate (EVA), polyacrylate (PA), polymethyl methacrylate (PMMA), polyurethane (PUR), and/or mixtures and copolymers thereof.

With the method presented, it is thus possible to work with a large number of materials.

In one embodiment of the invention, the display can be arranged outside the center relative to the first glass layer.

In other words, the invention permits a free arrangement of a display.

In another embodiment of the invention, the display is an OLED display.

Thus, even economical displays can be processed.

In yet another embodiment of the invention, the display occupies an area of less than 20% of the first glass layer.

In other words, even large displays can be installed.

According to another embodiment of the invention, the display has a display diagonal of at least 12 cm.

With this, displays for different purposes can be made available.

The composite glass panels thus produced can be used, for example, in vehicles or buildings or as an information display.

Figure 2:
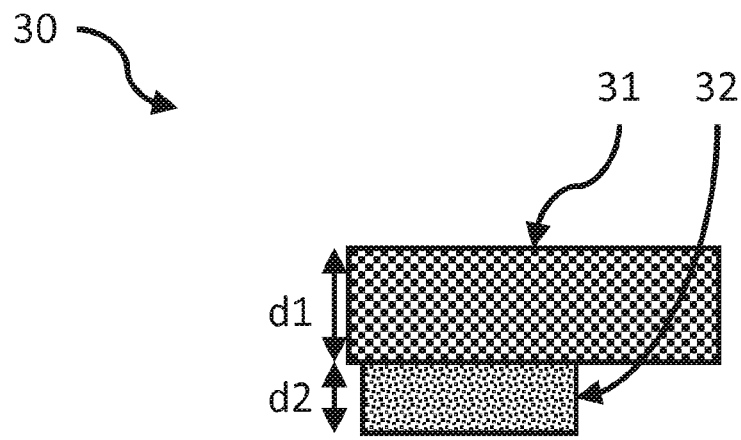
Figure 3:
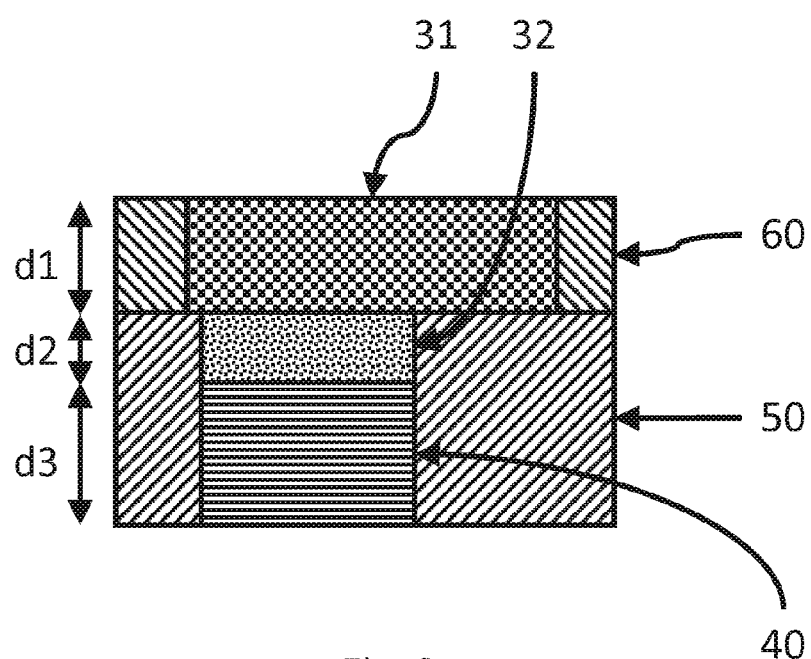
Figure 4:
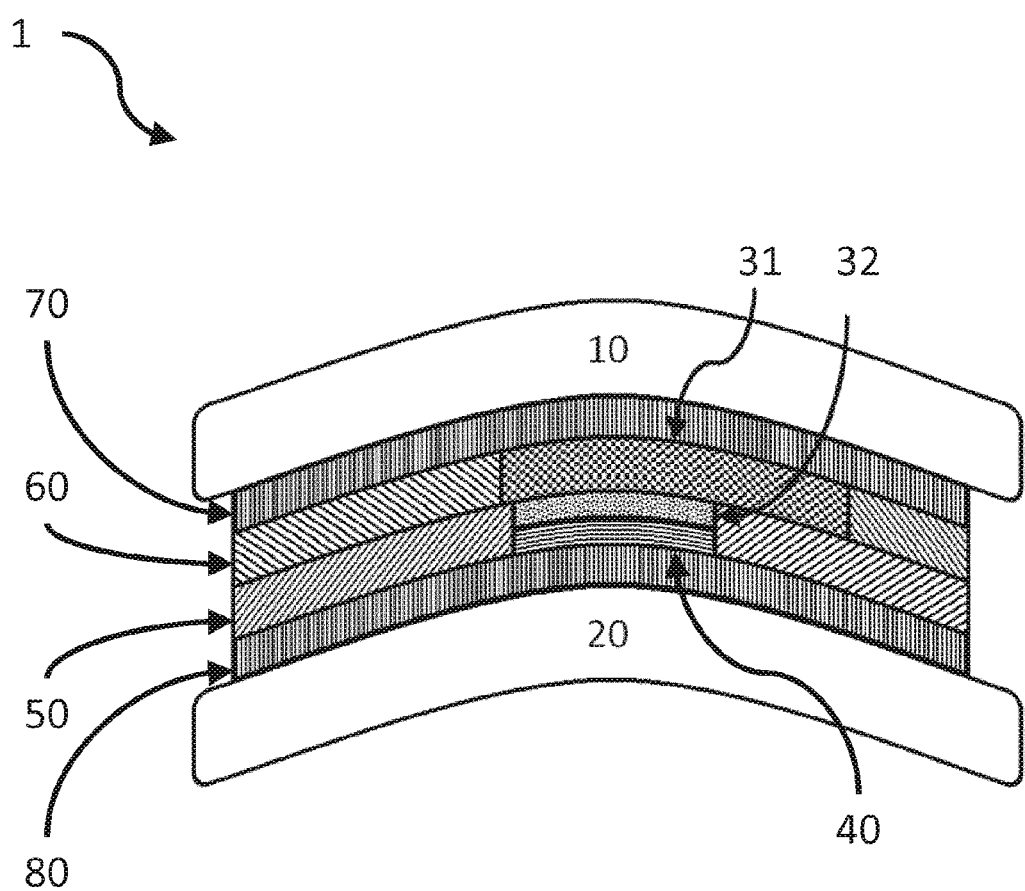
Figure 5:
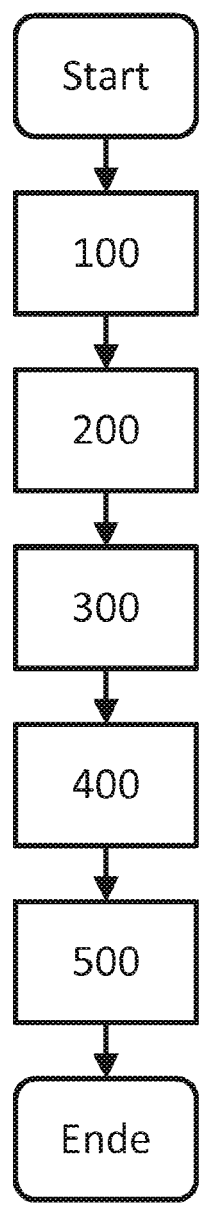
Figure 6:
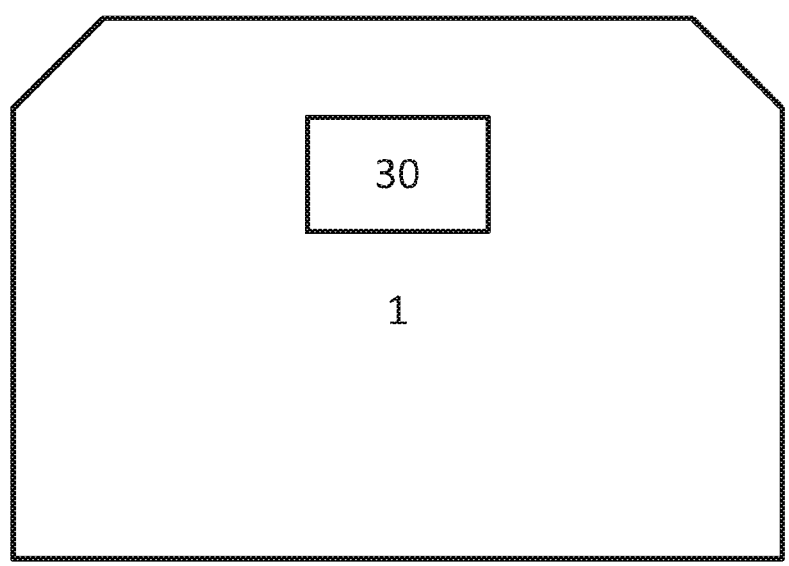

Embodiments of the present invention are described by way of example with reference to the appended drawings, which depict:

FIG. 1 a schematic sectional representation of a composite glass panel during production in accordance with methods according to the invention, FIG. 2 a schematic sectional representation of a detail of the invention, FIG. 3 a schematic sectional representation of another detail of the invention, FIG. 4 a schematic sectional representation of a composite glass panel after production in accordance with methods according to the invention, FIG. 5 a flowchart with steps in accordance with methods according to the invention, and FIG. 6 an assembly of a display in a composite glass panel according to the invention.

DETAILED PRESENTATION OF THE INVENTION WITH REFERENCE TO THE DRAWINGS

In the following, the invention is presented in greater detail with reference to the figures. It should be noted that different aspects are described that can, in each case, be used individually or in combination. In other words, any aspect can be used with different embodiments of the invention unless explicitly presented as a pure alternative.

Furthermore, for the sake of simplicity, usually only one entity is referenced in the following. Unless explicitly stated, the invention can include, however, in each case, a plurality of the entities concerned. Thus, the use of the words "a" and "an" is to be understood only as an indication that at least one entity is used in a simple embodiment.

In the methods described in the following, individual steps can be incorporated into a single step and, for example, executed in parallel. In addition, the order of steps can vary such that the presented order of steps must not be considered mandatory, unless a certain order is described as explicitly necessary.

In the following, reference is made to a display. A display has a large number of individually controllable electrical elements that either actively light up or, through control, change the reflectivity or transmittance such that light from another source can be controlled.

The method according to the invention for producing a curved composite glass panel 1 with an embedded coherent display 30 is depicted in FIG. 5. With the method according to the invention, a composite glass panel 1 is produced that is depicted sectionally as an end product in FIG. 4, and that is depicted schematically in FIG. 6 in plan view with reference the coherent display 30.

The composite glass panel 1 has a first curved glass layer 10 and a second curved glass layer 20.

The coherent display 30 that is depicted sectionally in FIG. 2 has a display layer and an electronics layer, wherein the display layer 31 and the electronics layer 32 are shaped differently. FIG. 3 shows, for example, that the display layer 31 has a different horizontal extension from the electronics layer 32. Alternatively, or additionally, the thickness (vertical extension) of the display layer 31 can also be different from the thickness (vertical extension) of the electronics layer 32.

The display layer 31 has, as depicted in FIGS. 2 and 3, a first layer thickness d1 and the electronics layer 32 has a second layer thickness d2.

Arranged between the electronics layer and the second glass layer is a first intermediate film 40, which has roughly the same area as the electronics layer 32. Here, it should be noted that the term "equal" and the term "roughly/approx." involve tolerances such that deviations of as much as 10% are considered essentially equal.

The first intermediate film 40 has a third layer thickness d3.

Arranged adjacent the electronics layer 32 and the first intermediate film 40 is—as can be seen in FIGS. 1 and 3—a second intermediate film 50, which has a layer thickness roughly equal to the sum of the second layer thickness d2 and the third layer thickness d3.

Arranged adjacent the display layer 31 is a third intermediate film 60, which has a layer thickness roughly corresponding to the first layer thickness d1.

In other words, different height profiles of the electronics layer 32 and of the display layer 12 can be compensated by means of the different layer thicknesses such that, in an intermediate step, an assembly according to FIG. 1 substantially results, in which the different heights are compensated by intermediate films of different thicknesses. In addition, the intermediate film 40 on the electronics layer 32 is a thermal buffer such that the temperature rise can be more evenly distributed and the formation of a thermal bridge to the glass layer 20 is avoided.

The materials of the individual intermediate films can be selected different, yielding, for example, different thermal conductivity properties for the processing of the composite glass panel 1 and for the operation of the display 30. For example, improved heat distribution can be made available by the intermediate film 40 such that, for one thing, thermal hotspots and thus different optical behavior do not occur during production, and, for another, heat can be more evenly dissipated during operation of the display 30, as a result of which the durability of the display 30 is improved. In addition, with the different intermediate films, other functions, such as antireflection coating, heat conduction, etc., can also be provided.

The composite glass panel further has a first bonding layer 70 between the first glass layer 10 and the third intermediate film 60 and between the first glass layer 10 and the display layer 31. The composite glass panel further has a second bonding layer 80 between the second glass layer 20 and the first intermediate film 40 and between the second glass layer 20 and the second intermediate film 50.

The production method according to the invention now has, initially, the step 100 of obtaining the first curved glass layer 10 and the second curved glass layer 20 and the step 200 of obtaining a non-curved display 30.

In step 300, the non-curved coherent display 30 obtained is arranged between the first curved glass layer 10 and the second curved glass layer 20 such that the third intermediate film 60 is arranged adjacent the display layer 31, and such that the second intermediate film 50 is arranged adjacent the electronics layer 32 and the first intermediate film 40, with the first bonding layer 70 arranged above the display layer 31, and with the second bonding layer 80 arranged below the first intermediate film 40.

For example, the first bonding layer 70 can initially be placed on the first glass layer 10. Then, the coherent display 30 is placed on the first bonding layer 70, with the display layer 31 in contact with the first bonding layer 70. Then, the third intermediate film 60 is placed around the display layer 31 as (a large number of) strips or as a pass-partout. Then, the second intermediate film 50 can be placed around the electronics layer 32 as (a large number of) strips or a pass-partout. Now, in the resultant depression, a surface of the first intermediate film 40 is placed over the electronics layer 32. Then, a first bonding layer 80 is placed. Then, the second glass layer 20 is placed thereon. This creates an almost flat assembly with an almost uniform height profile.

The assembly is then warmed, in a step 400, at least in the region of the display 30 at a temperature of 50° C.-100° C. such that, under the influence of warming, the display layer 31 and the electronics layer 32 bend and adapt to the curve of the first glass layer 10 or second glass layer 20. The term "adapt" also involves tolerances. In other words, the display layer and the electronics layer bend, until the radii of curvature reach the radius of curvature of the glass layers 10 or 20. In other words, the warming step relaxes the material of the display layer 31 and of the electronics layer 32 and this leads at least partially into the phase transition range. Then, in a step 500, the coherent display 30 thus curved is bonded to the other layers by means of an autoclave.

In other words, the invention enables introducing even large-format (previously non-curved) displays into curved panels, without the panel thickness being negatively affected or without running the risk of either the display layer or the electronics layer being compromised.

In addition, it should be noted that the resultant composite glass panel 1 has better transparency properties. In particular, it has been found that, due to the uniform warming, there are fewer optical defects. If the warming is uneven, this can cause uneven melting and, consequently, optical defects.

In one embodiment of the invention, the step 400 of warming includes a temperature rise in a period of more than 30 minutes.

Due to the relatively long temperature rise, the display layer 31 and the electronics layer 32 are warmed so slowly that the electronics layer 32 and the display layer 31, which are each constructed of different materials, warm up evenly, such that no large temperature gradients develop that could result in cracks in the electronics or the connection of the electronics layer to the display layer.

For example, this step of warming can include warming to 90° C. and maintaining the temperature over a period of several hours, e.g., 18 hours.

Here, the times and temperatures can differ for displays 30 of different sizes as well as for displays 30 to be bent more or less sharply. It is also readily possible to warm only the region of the display and its close surroundings since, essentially, only the display 30 has to be bent (slowly) under the influence of heat and the weight forces acting on it.

The object is also accomplished by a composite glass panel 1 that is produced with one of the methods according to the invention.

In one embodiment of the invention, the first intermediate film 40 and/or the second intermediate film 50 and/or the third intermediate film 60 contains at least one material selected from the group comprising polybutylene terephthalate (PBT), polycarbonate (PC), polyethylene terephthalate (PET) and polyethylene naphthalate (PEN), polyvinyl chloride (PVC), polyvinyl fluorides (PVF), polyvinyl butyral (PVB), ethylene vinyl acetate (EVA), polyacrylate (PA), polymethyl methacrylate (PMMA), polyurethane (PUR), and/or mixtures and copolymers thereof.

In one embodiment of the invention, the first bonding layer 70 and/or the second bonding layer 80 contains at least one material selected from the group comprising polybutylene terephthalate (PBT), polycarbonate (PC), polyethylene terephthalate (PET) and polyethylene naphthalate (PEN), polyvinyl chloride (PVC), polyvinyl fluorides (PVF), polyvinyl butyral (PVB), ethylene vinyl acetate (EVA), polyacrylate (PA), polymethyl methacrylate (PMMA), polyurethane (PUR), and/or mixtures and copolymers thereof.

With the method presented, is thus possible to work with a large number of materials. In particular, it is also possible to work with conventional material systems.

In one embodiment of the invention, the display 30 can be arranged outside the center relative to the first glass layer 10 of the composite glass panel 1. Such an assembly is depicted in FIG. 6. In other words, the invention permits a free arrangement of a display.

In another embodiment of the invention, the display 30 is an OLED display. Thus, even economical displays can be processed. Other displays 30, in particular those with a thin glass layer or other display methods, such as e-paper, are not excluded from the method according to the invention.

In yet another embodiment of the invention, the display 30 occupies an area of less than 20% of the first glass layer 10. In other words, even large displays can be installed.

According to another embodiment of the invention, the display 30 has a display diagonal of at least 12 cm. For example, displays with a diagonal of 12 cm or more can be used in vehicles as rearview mirrors (working with a rearview/backup camera). Other sizes, for example, 17 cm-33 cm or more, allow use as information displays, as a navigation system, telephone, multimedia player, man-machine-interface, etc.

Other sizes and other uses, e.g., information providers/status indicators, etc. in small displays are, of course, also feasible. Of course, it is readily possible to also use the entire size of the composite glass panel 1 as a display.

If a large area of the composite glass panel 1 is occupied by the display 30, this can, depending on the transparency of the display 30, enable use for certain purposes, e.g., as an information display/controllable curved partition wall panel.

Without loss of generality, a connection element can, of course, also be provided on the composite glass panels on one of the glass layers and/or on the edge of the composite glass panel 1, making connection to the electronics layer 32 available.

The composite glass panels thus produced can be used, for example, in vehicles, e.g., as a windshield, rear window, or side window, or in buildings or as an information display. The method according to the invention enables economical production based on (significantly cheaper) non-curved coherent displays 30.

LIST OF REFERENCE CHARACTERS 1 composite glass panel
10 first curved glass layer
20 second curved glass layer
30 coherent display
10 first curved glass layer
20 second curved glass layer
31 display layer
32 electronics layer
40 first intermediate film
50 second intermediate film
60 third intermediate film
70 first bonding layer
80 second bonding layer
d1 first layer thickness
d2 second layer thickness
d3 third layer thickness
Method Steps
100 Obtaining the first curved glass layer and the second curved glass layer
200 Obtaining a substantially non-curved display
300 Arranging the display obtained
400 Warming the assembly
500 Bonding the arranged curved layers by means of an autoclave

The invention claimed is:

1. Method for producing a curved composite glass panel with an embedded curved coherent display, the composite glass panel having a first curved glass layer and a second curved glass layer, wherein the display has a display layer and an electronics layer, wherein the display layer and the electronics layer are shaped differently, wherein the display layer has a first layer thickness and the electronics layer has a second layer thickness, wherein a first intermediate film is arranged between the electronics layer and the second curved glass layer, which first intermediate film has the same area as the electronics layer and has a third layer thickness, and wherein a second intermediate film is arranged adjacent the electronics layer and the first intermediate film, which second intermediate film has a layer thickness equal to the sum of the second layer thickness and the third layer thickness, and wherein a third intermediate film is arranged adjacent the display layer, which third intermediate film has a layer thickness roughly corresponding to the first layer thickness, wherein the composite glass panel further has a first bonding layer between the first curved glass layer and the third intermediate film and between the first curved glass layer and the display layer, and has a second bonding layer between the second curved glass layer and the first intermediate film and between the second curved glass layer and the second intermediate film, the method comprising:

obtaining the first curved glass layer and the second curved glass layer,
obtaining a non-curved coherent display,
arranging the non-curved coherent display obtained between the first and second curved glass layers to form an assembly such that the third intermediate film is arranged adjacent the display layer, and such that the second intermediate film is arranged adjacent the electronics layer and the first intermediate film, wherein the first bonding layer is arranged above the display layer, and wherein the second bonding layer is arranged below the first intermediate film,
warming the assembly at least in the region of the non-curved coherent display at a temperature of 50° C.-100° C. such that, under the influence of the warming, the display layer and the electronics layer bend and adapt to the curve of the first curved glass layer or second curved glass layer,
bonding the arranged curved layers by means of an autoclave.

2. The method according to claim 1, wherein the warming of the assembly includes a temperature rise in a period of more than 30 minutes.

3. A curved composite glass panel with an embedded curved coherent display, the curved composite glass panel having a first curved glass layer and a second curved glass layer, wherein the display has a display layer and an electronics layer, wherein the display layer and the electronics layer are shaped differently, wherein the display layer has a first layer thickness and the electronics layer has a second layer thickness, wherein a first intermediate film is arranged between the electronics layer and the second curved glass layer, which first intermediate film has the same area as the electronics layer and has a third layer thickness, and wherein a second intermediate film is arranged adjacent the electronics layer and the first intermediate film, which second intermediate film has a layer thickness equal to the sum of the second layer thickness and the third layer thickness, and wherein a third intermediate film is arranged adjacent the display layer, which third intermediate film has a layer thickness roughly corresponding to the first layer thickness, wherein the composite glass panel further has a first bonding layer between the first curved glass layer and the third intermediate film and between the first curved glass layer and the display layer, and has a second bonding layer between the second curved glass layer and the first intermediate film and between the second curved glass layer and the second intermediate film, the curved composite glass panel being obtained by a method comprising:

obtaining the first curved glass layer and the second curved glass layer, obtaining a non-curved coherent display,
arranging the non-curved coherent display obtained between the first and second curved glass layers to form an assembly such that the third intermediate film is arranged adjacent the display layer, and such that the second intermediate film is arranged adjacent the electronics layer and the first intermediate film, wherein the first bonding layer is arranged above the display layer, and wherein the second bonding layer is arranged below the first intermediate film,
warming the assembly at least in the region of the non-curved coherent display at a temperature of 50° C.-100° C. such that, under the influence of the warming, the display layer and the electronics layer bend and adapt to the curve of the first curved glass layer or second curved glass layer, and bonding the arranged curved layers by means of an autoclave.

4. The curved composite glass panel according to claim 3, wherein the first, second and third intermediate films contain at least one material selected from the group consisting of polybutylene terephthalate PBT), polycarbonate (PC), polyethylene terephthalate (PET) and polyethylene naphthalate (PEN), polyvinyl chloride (PVC), polyvinyl fluorides (PVF), polyvinyl butyral (PVB), ethylene vinyl acetate (EVA), polyacrylate (PA), polymethyl methacrylate (PMMA), polyurethane (PUR), and/or mixtures and copolymers thereof.

5. The curved composite glass panel according to claim 3, wherein the first and second bonding layers contain at least one material selected from the group consisting of polybutylene terephthalate (PBT), polycarbonate (PC), polyethylene terephthalate (PET) and polyethylene naphthalate (PEN), polyvinyl chloride (PVC), polyvinyl fluorides (PVF), polyvinyl butyral (PVB), ethylene vinyl acetate (EVA), polyacrylate (PA), polymethyl methacrylate (PMMA), polyurethane (PUR), and/or mixtures and copolymers thereof.

6. The curved composite glass panel according to claim 3, wherein the display is arranged outside the center relative to the first curved glass layer.

7. The curved composite glass panel according to claim 3, wherein the display is an OLED display.

8. The curved composite glass panel according to claim 3, wherein the non-curved coherent display occupies an area of less than 20% of the first curved glass layer.

9. The curved composite glass panel according to claim 3, wherein the non-curved coherent display has a display diagonal of at least 12 cm.

10. A method comprising utilizing a curved composite glass panel according to claim 3 in a vehicle or a building or as an information display.

* * * * *